United States Patent
Kim

(10) Patent No.: US 8,907,361 B2
(45) Date of Patent: Dec. 9, 2014

(54) LIGHT EMITTING DIODE PACKAGE AND FABRICATION METHOD THEREOF

(71) Applicant: Samsung Electronics Co., Ltd., Gyeonggi-do (KR)

(72) Inventor: Han Hyoung Kim, Gyeonggi-do (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 2 days.

(21) Appl. No.: 13/647,099

(22) Filed: Oct. 8, 2012

(65) Prior Publication Data
US 2013/0087822 A1   Apr. 11, 2013

(30) Foreign Application Priority Data
Oct. 6, 2011 (KR) .................. 10-2011-0101741

(51) Int. Cl.
*H01L 33/00* (2010.01)
*H01L 33/54* (2010.01)

(52) U.S. Cl.
CPC ........... *H01L 33/54* (2013.01); *H01L 2933/005* (2013.01)
USPC ................................ 257/98; 257/99; 257/100

(58) Field of Classification Search
USPC .................................................. 257/79–103
See application file for complete search history.

(56) References Cited

U.S. PATENT DOCUMENTS

| | | | |
|---|---|---|---|
| 7,192,802 B2 * | 3/2007 | Stecker et al. | 438/57 |
| 8,575,646 B1 * | 11/2013 | Shum | 257/100 |
| 2009/0134417 A1 * | 5/2009 | Sato et al. | 257/98 |
| 2010/0283387 A1 * | 11/2010 | Lin et al. | 313/506 |
| 2012/0074434 A1 | 3/2012 | Park et al. | |
| 2012/0235190 A1 * | 9/2012 | Keller et al. | 257/98 |

FOREIGN PATENT DOCUMENTS

| JP | 2003-344640 A | 12/2003 |
|---|---|---|
| JP | 2006-173536 A | 6/2006 |
| JP | 2010-238846 A | 10/2010 |
| KR | 2008-0006181 A | 1/2008 |
| KR | 10-1054769 B1 | 8/2011 |

OTHER PUBLICATIONS

Jie Han and Wei Gao, "Surface Wettability of Nanostructured Zinc Oxide Films", 2009, Journal of Electronic Materials, vol. 38 No. 4.*
Korean Office Action issued in KR 10-2011-0101741 dated Oct. 8, 2012.
Decision to Grant a Patent Korean Patent Application No. 10-2011-0101741 dated Sep. 25, 2013.
S.J. Adamson et al., "Dam and Fill Encapsulation for Microelectronic Packages," Nepcon West, Feb. 1999, Anaheim, CA.
The International Reference for Chip-Scale Electronics, Flip-Chip Technology, Optoelectronic Interconnection and Wafer-Level Packaging, Jan.-Feb. 2002.
J. Han et al., Surface Wettability of Nanostructural Zinc Oxide Films, Journal of Electronic Materials, vol. 38, No. 4, 2009.

* cited by examiner

*Primary Examiner* — Earl Taylor
*Assistant Examiner* — Frederick B Hargrove
(74) *Attorney, Agent, or Firm* — McDermott Will & Emery LLP

(57) ABSTRACT

There is provided a light emitting diode (LED) package including: a package main body; an LED chip mounted on the package main body; and a hydrophobic pattern formed on the package main body spaced apart from the LED chip; and a resin unit encapsulating the LED chip and the resin unit is defined by the hydrophobic pattern. The LED package and a fabrication thereof which incur less production costs and have various patterns and enhanced intensity of illumination can be provided.

11 Claims, 8 Drawing Sheets

LIGHT EMITTING DIODE PACKAGE AND FABRICATION METHOD THEREOF

CROSS-REFERENCE TO RELATED APPLICATIONS

This application claims the priority to Korean Patent Application No. 10-2011-0101741 filed on Oct. 6, 2011, in the Korean Intellectual Property Office, the disclosure of which is incorporated herein by reference.

BACKGROUND

1. Field of the Invention

The present invention relates to a light emitting diode package and a fabrication method thereof.

2. Description of the Related Art

A light emitting diode (LED) is a device including a material that emits light by using electrical energy, in which energy generated by electron hole recombination in semiconductor junction parts is converted into light to be emitted therefrom. LEDs are commonly employed as light sources in illumination devices, display devices, and the like, and the development of LEDs has thus been accelerated.

In particular, recently, the development and employment of gallium nitride-based LEDs has been increased, and mobile keypads, side viewers, camera flashes, and the like, using such a gallium nitride-based LED, have been commercialized, and in line with this, the development of general illumination devices using LEDs has accelerated. Like the products to which they are applied, such as a backlight unit of a large TV, a headlamp of a vehicle, a general illumination device, and the like, the purposes of LEDs are gradually moving toward large-sized products having a high output and high efficiency, the characteristics of LEDs used for such purposes being required to satisfy the high level of the characteristics of the LEDs.

In the related art LED, a dam is formed on a package main body, and an LED chip is then encapsulated (with resin, or the like, held in place by the dam), and here, the types of dam patterns that can be formed are limited, making it difficult to fabricate an LED having various types of light extraction surface patterns.

SUMMARY

An aspect of the present disclosure provides a light emitting diode (LED) package having reduced production costs, various light extraction surface patterns, and enhanced illumination intensity.

Another aspect of the present disclosure provides a method for fabricating an LED package as mentioned above.

According to an aspect of the present disclosure, there is provided a light emitting diode (LED) package including: a package main body; an LED chip mounted on the package main body; and a hydrophobic pattern formed on the package main body spaced apart from the LED chip; and a resin unit encapsulating the LED chip, wherein the resin unit is defined by the hydrophobic pattern.

The hydrophobic pattern may include a plurality of nano-structures. The hydrophobic pattern may include: a seed layer pattern formed on the package main body; and a plurality of nano-structures grown from the seed layer pattern.

The resin unit may include a phosphor. The resin unit may have a contact angle of 90° or greater with regard to the package main body.

The hydrophobic pattern may include a circular shape, a triangular shape, a quadrangular shape, and any combination thereof. The hydrophobic pattern may comprise at least two spaced apart patterns formed in a same manner.

The LED package may further include: a lens encapsulating the resin, wherein the lens is defined by the hydrophobic pattern. The lens may have a contact angle of 90° or greater with regard to the package main body.

The hydrophobic pattern may be subjected to an $O_2$ plasma or an $H_2$ plasma treatment, or may be fluorocarbonated.

The nano-structures may be made of a zinc oxide (ZnO)-based compound.

The seed layer pattern may be gold (Au), copper (Cu), an alloy thereof, or may be ZnO.

The seed layer pattern may have a multilayered structure in which gold (Au) and copper (Cu) are alternately stacked.

According to another aspect of the present disclosure, there is provided a light emitting diode (LED) package including: a package main body; an LED chip mounted on the package main body; and a hydrophilic pattern formed on the package main body to be spaced apart from the LED chip; and a resin unit encapsulating the LED chip, wherein the resin unit is defined by the hydrophilic pattern.

The hydrophilic pattern may include a plurality of nano-structures. The hydrophilic pattern may be subjected to an $O_2$ plasma treatment.

According to another aspect of the present disclosure, there is provided a method for fabricating a light emitting diode (LED) package, including: forming a hydrophobic pattern on a package main body; mounting an LED chip on a region formed by the hydrophobic pattern; and encapsulating the LED chip with a resin.

The hydrophobic pattern may include a plurality of nano-structures. The nano-structures may be grown from a seed layer pattern after the seed layer pattern is formed on the package main body.

The seed layer pattern may be immersed in $(Zn(NO_3)_2 \cdot 6H_2O)$, and ZnO nano-structures may be formed on the seed layer pattern.

The seed layer pattern may be made of gold (Au), copper (Cu), and an alloy thereof, or the seed layer pattern may be made of ZnO.

The seed layer pattern may be formed to be multi-layered by alternately stacking gold (Au) and copper (Cu).

The method may further include: performing an O2 plasma or an H2 plasma treatment on the hydrophobic pattern or fluorocarbonating the hydrophobic pattern.

The method may further include: forming a lens on the resin unit after forming the resin unit encapsulating the LED chip.

The nano-structures may be made of a zinc oxide (ZnO)-based compound.

According to another aspect of the present disclosure, there is provided a method for fabricating a light emitting diode (LED) package, including: forming a hydrophobic pattern on a package main body; modifying the surface of the package with the hydrophobic pattern formed thereon into a surface having hydrophilicity; mounting an LED chip on a portion of the surface of the package; and encapsulating the LED chip with a resin.

The hydrophobic pattern may include a plurality of nano-structures, and the modifying of the surface of the package main body into a surface having hydrophilicity may be realized through performing an $H_2$ plasma treatment or performing fluorocarbonation.

According to another aspect of the present disclosure, a light emitting diode (LED) package comprises a package main body and an LED chip mounted on the package main body. A first pattern, comprising a first plurality of nanostructures, is formed on the package main body. The first pattern is spaced apart from and surrounds the LED chip. A light-transmissive resin unit encapsulates the LED chip. The outer boundary of the resin unit is defined by the pattern.

In certain embodiments of the disclosure, a second pattern comprising a second plurality of nano-structures is formed on the package main body. The second pattern is spaced apart from the first pattern and surrounds the LED chip.

In certain embodiments, the first and second patterns are subjected to an $O_2$ plasma or an $H_2$ plasma treatment, or are fluorocarbonated.

In certain embodiments, the nano-structures are made of a zinc oxide (ZnO)-based compound.

In other embodiments of the present disclosure, a method for fabricating a light emitting diode (LED) package is provided, wherein the method comprises forming a first pattern having a first plurality of nano-structures on a package main body. An LED chip is mounted on a region formed by the first pattern. The first pattern is spaced apart from and surrounds the LED chip, and the LED chip is encapsulated with a resin to form a resin unit. The outer boundary of the resin unit is defined by the pattern.

In certain embodiments of the disclosure, a seed layer pattern is formed on the package main body, and the nano-structures are grown from the seed layer pattern.

In certain embodiments, a second pattern comprising a second plurality of nano-structures is formed on the package main body and the second pattern is spaced apart from the first pattern and surrounds the LED chip.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1A:
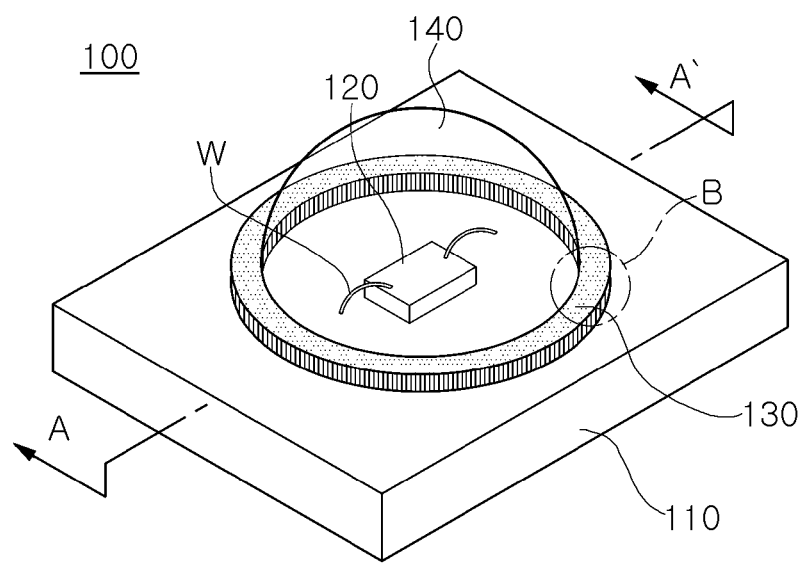
FIG. 1A is a perspective view schematically showing a light emitting diode (LED) package according to a first embodiment of the present disclosure.

Embodiments of the present disclosure will now be described in detail with reference to the accompanying drawings. The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art. In the drawings, the shapes and dimensions of elements may be exaggerated for clarity, and the same reference numerals will be used throughout to designate the same or like components.

First, a light emitting diode (LED) package according to an embodiment of the present disclosure will be described, and then, a method for fabricating an LED package according to an embodiment of the present disclosure will be described.

Figure 1B:
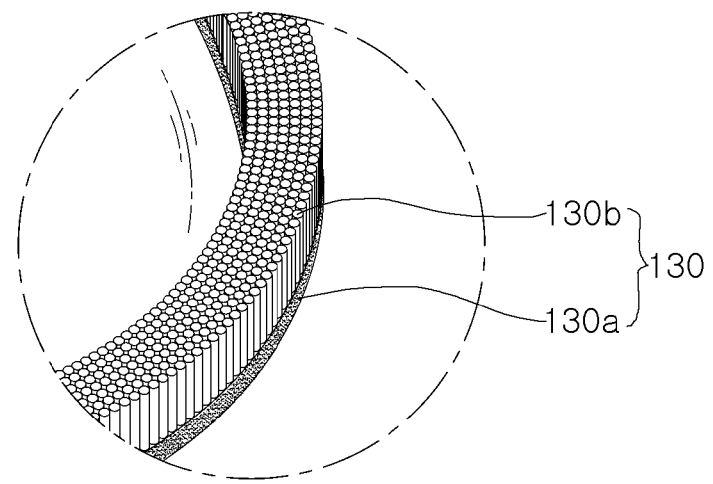
FIG. 1B is an enlarged view of 'B' in FIG. 1A.
Figure 2:
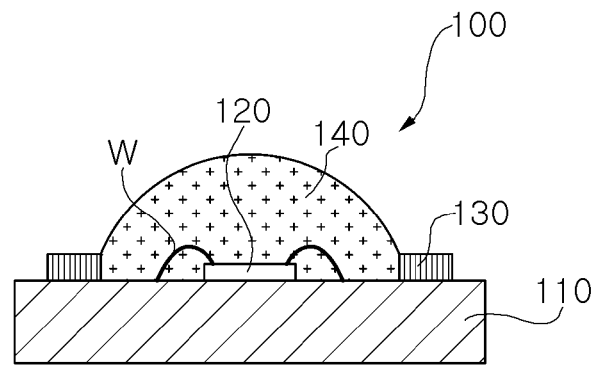
FIG. 2 is a view schematically showing the section of the LED package illustrated in FIG. 1A taken along line A-A'.

FIG. 1A is a perspective view schematically showing a light emitting diode (LED) package according to a first embodiment of the present disclosure. FIG. 1B is an enlarged view of 'B' in FIG. 1A. FIG. 2 is a view schematically showing the section of the LED package illustrated in FIG. 1A taken along line A-A'.

As shown in FIGS. 1A and 2, an LED package 100 according to a first embodiment of the present disclosure includes a package main body 110, an LED chip 120, a hydrophobic pattern 130, and a resin unit 140.

The LED chip 120 is mounted on one surface of the package main body 110, and the surface of the package main body 110 on which the LED chip 120 is mounted may be formed to be recessed, with a circumference thereof formed as a sloped face.

The LED chip 120 is mounted on one surface of the package main body 110 and may be obtained by epitaxially growing a semiconductor layer on a growth substrate. In this case, the growth substrate may be made of sapphire, but the present disclosure is not limited thereto. For example, a known growth substrate made of a material such as spinel, SiC, GaN, GaAs, or the like, may be used. In detail, the LED chip 120 may be made of BN, SiC, ZnSe, GaN, InGaN, InAlGaN, AlGaN, BAlGaN, BInAlGaN, or the like, and doped with silicon (Si), zinc (Zn), or the like. Here, in the present embodiment, the LED is taken as an example, but any photoelectric element may be used so long as it emits light when an electrical signal is applied thereto. For example, a laser diode, a photodiode, an organic light emitting diode (OLED), or the like, may be used.

Also, a light emitting layer of the LED chip 120 may be made of nitride semiconductor formed of $In_xAl_yGa_{1-x-y}$ ($0 \leq X \leq 1$, $0 \leq Y \leq 1$, $0 \leq X+Y \leq 1$), and may have a single or multi-quantum well structure to enhance an output therefrom.

Electrodes (not shown) formed on an upper surface of the LED chip 120 may be wire-bonded with a lead frame (not shown) on the package main body 110 so as to receive an electrical signal from the outside. In the present embodiment, both electrodes formed on the upper surface of the LED chip 120 are wire-bonded with a lead frame, but alternatively, the electrodes may be directly electrically connected to the lead frame provided at a mounting region of the LED chip, rather than using wires, and connected to a lead frame, which is not provided on the mounting region, through a conductive wire. Namely, specific connection schemes may be variably changed as necessary. Also, in the present disclosure, only a single LED chip 120 is illustrated within the package main body 110, but two or more LED chips may be provided.

As shown in FIGS. 1A and 1B, the hydrophobic pattern 130 is formed to be spaced apart from the LED chip 120 on the package main body 110. The hydrophobic pattern 130 may be formed as a continuous pattern to completely surround the LED chip 120, or may be formed as a discontinuous pattern formed at certain intervals.

The hydrophobic pattern 130 serves as a dam for restricting the resin unit 140 having hydrophilic qualities to only be formed within a region defined by the hydrophobic pattern 130.

The hydrophobic qualities of the hydrophobic pattern 130 may be implemented by a lotus effect. The lotus effect refers to a phenomenon in which the surface of a lotus leaf assumes super-hydrophobic qualities due to fine projections formed on the surface thereof, which do not allow drops of water to be attached to the surface of the lotus leaf.

Figure 15:
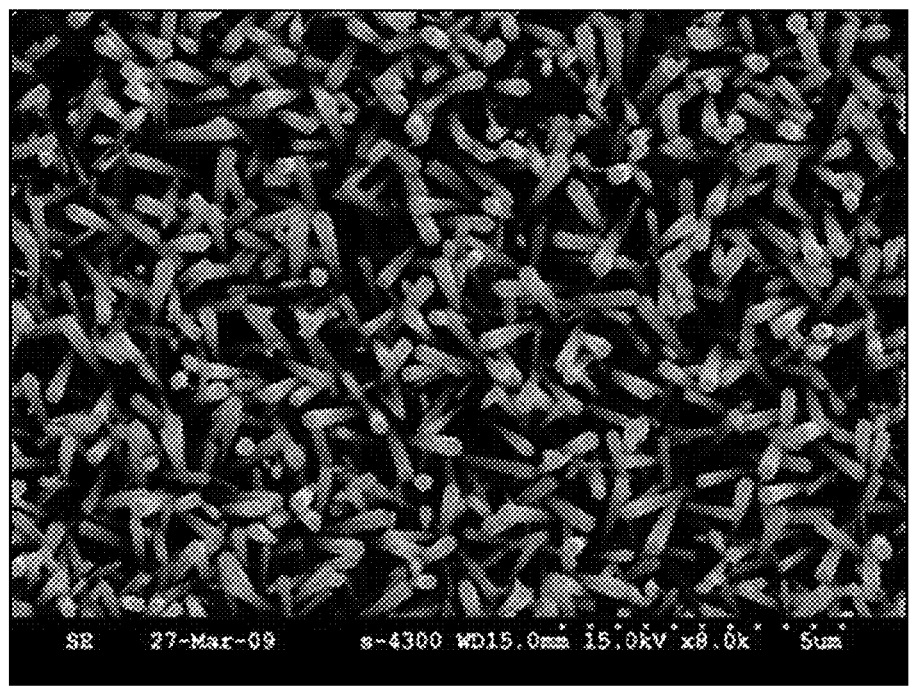
FIG. 15 is an SEM photograph obtained by capturing a nano-structure.

In the present embodiment, in order to allow the hydrophobic pattern 130 formed on the package main body 110 of the LED 100 to have the hydrophobic qualities, the hydrophobic pattern 130 may include a plurality of nano-structures 130b as shown in FIG. 15.

The nano-structures 130b are an aggregate of fine patterns on the nano scale. As shown in FIG. 15, the nano-structures 130b may be formed on the nano scale to be column shaped, needle shaped, tube shaped, plate shaped, or the like, and to have one horizontal sectional shape among polygonal shapes including a circular shape, a quadrangular shape, and a hexagonal shape.

Also, the hydrophobic properties of the hydrophobic pattern 130 may be changed according to the length and the size of the nano-structures 130b and the intervals between the nano-structures 130b. The length of the nano-structures 130b may be controlled by regulating a reaction time when the nano-structures 130b are grown.

The nano-structures 130b of the hydrophobic pattern 130 may be made of a zinc oxide (ZnO)-based compound.

The nano-structures 130b may be grown from the package main body 110 through a method such as chemical vapor deposition (CVD), or the like. Alternatively, in order to simplify the manufacturing process and reduce the production costs, the nano-structures 130b may be formed by forming a seed layer pattern made of gold (Au), copper (Cu), or an alloy thereof, and then immersing the seed layer pattern in a solution including a mixture of $(Zn(NO_3)_2 \cdot 6H_2O)$ and hexamethylene tetramine (HMT).

Also, in order to enhance light transmittance and electrical conductivity of the nano-structures 130b, the nano-structures 130b may be thermally treated at a temperature of 800° C. or lower under an oxygen $(O_2)$, nitrogen $(N_2)$, hydrogen $(H_2)$, argon (Ar) or air atmosphere, as well as in a vacuum.

Also, in order to regulate the hydrophobic and hydrophilic qualities of the hydrophobic pattern 13, the hydrophobic pattern 130 may be subjected to a plasma treatment using oxygen $(O_2)$ or hydrogen $(H_2)$ ions at a temperature of 800° C. or lower, or may be subjected to a fluorocarbon treatment.

When the surface of the nano-structures 130b undergoes the hydrogen $(H_2)$ plasma treatment or the fluorocarbon treatment, the hydrophobicity of the nano-structures 130b are strengthened, and when the surface of the nano-structures 130b undergoes the oxygen $(O_2)$ plasma treatment, the hydrophobicity of the nano-structures 130b is weakened to assume hydrophilicity. When the hydrophobicity of the nano-structures 130b is strengthened to have super-hydrophobicity, the resin unit 140 formed within the region defined by the hydrophobic pattern 130 may be formed to have a droplet shape.

Figure 14A:
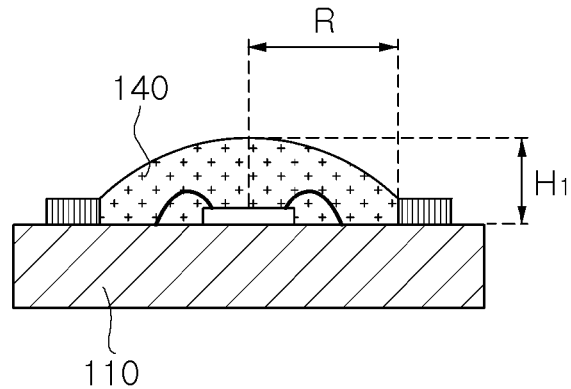
FIGS. 14A through 14C are view showing a change in the shape of the LED package.
Figure 14B:
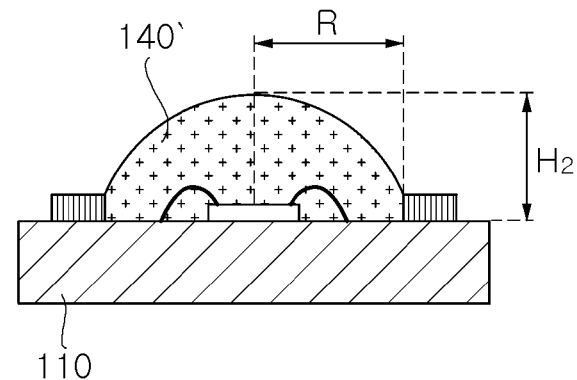
Figure 14C:
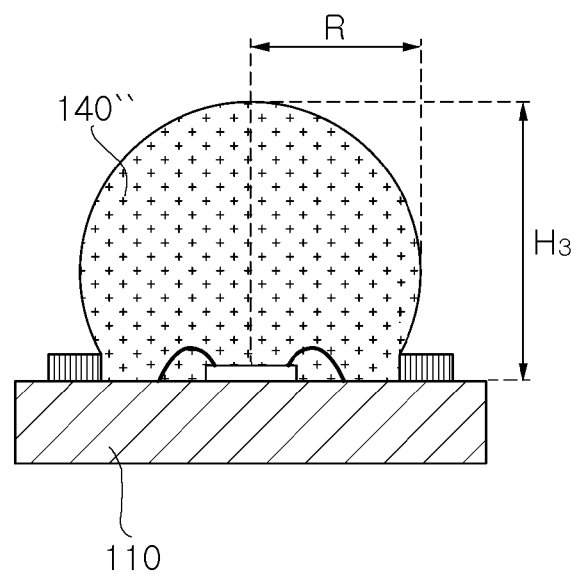

In detail, as shown in FIGS. 14A through 14C, when the hydrophobicity of the nano-structures 130b is strengthened, the resin unit 140 including a larger amount of droplets may be formed.

As shown in FIG. 14C, when the hydrophobicity of the nano-structures 130b is strengthened to assume super-hydrophobicity, a resin unit 140" having a droplet shape with a contact angle of 90° or greater over the package main body 110 may be formed.

In this manner, when the contact angle of the resin unit 140" is 90° or greater, since a height H3 is greater than a radius R, the resin unit 140" has an enhanced intensity of illumination in comparison to the resin units 140 and 140' having a relatively low contact angle, as illustrated in FIGS. 14A and 14B, respectively.

Also, two or more hydrophobic patterns 130 may be formed in a duplicated manner, and thus, several resin units 140 may be formed in a folded manner in the regions defined by the hydrophobic patterns 130, and a lens 350 (see FIG. 4) may be formed to have a size different from that of the resin unit 140.

As described above, the hydrophobic pattern 130 may serve as a dam allowing the resin unit 140 encapsulating the LED chip 120 to be formed and maintained in a certain shape in a packaging process, so the hydrophobic pattern 130 can be advantageously formed in various patterns.

Also, when a general dam pattern is formed to form the resin unit, and then, the resin unit is formed therein, a difference is generated in the width of the dam pattern due to tolerance in terms of the fabrication process, causing a possibility that the resin will overflow. However, in the present embodiment, when the hydrophobic pattern 130 is used, since the hydrophilic resin is confined by the hydrophobic pattern, the resin is prevented from overflowing during a dispensing process.

The resin unit 140 encapsulating the LED chip 120 is formed in the region defined by the hydrophobic pattern 130.

The material constituting the resin unit 140 is not particularly limited so long as it is light-transmissive, and an insulating resin having translucency, such as a silicon resin composition, a modified silicon resin composition, an epoxy resin composition, a modified epoxy resin composition, an acryl resin composition, and the like, can be applicable. Also, a resin having excellent weatherability such as a hybrid resin, or the like, including one or more of silicon, epoxy, and a fluorocarbon resin, may also be used.

In certain embodiments, a transparent liquid resin for forming the resin unit according to the present disclosure may contain at least one type of phosphor.

The phosphor may convert a light wavelength into any one of yellow, red, and green light wavelengths, and the type of phosphor used therefor may be determined by a light wavelength emitted from an active layer of the LED chip 120. In detail, the phosphor may include any one of YAG-based, TAG-based, silicate-based, sulfide-based, and nitride-based fluorescent materials. For example, when a phosphor converting a light wavelength into a yellow light wavelength is applied to a blue LED chip, an LED emitting white light can be obtained.

An LED package 200 according to a second embodiment of the present disclosure will hereinafter be described. The LED package 200 according to the second embodiment of the present disclosure additionally includes the lens 250 in the LED package 100 according to the first embodiment of the present disclosure.

Figure 3:
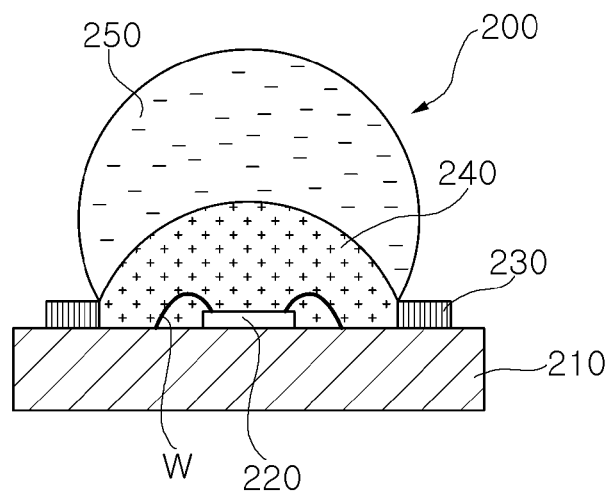
FIG. 3 is a sectional view schematically showing a light emitting diode (LED) package according to a second embodiment of the present disclosure.

FIG. 3 is a sectional view schematically showing a light emitting diode (LED) package according to the second embodiment of the present disclosure.

As shown in FIG. 3, the LED package 200 according to a second embodiment of the present disclosure includes a package main body 210, an LED chip 220, a hydrophobic pattern 230, a resin unit 240, and the lens 250.

Similar to the case as described above, the LED chip 220 is mounted on one surface of the package main body 210, and the surface of the package main body 210 on which the LED chip 220 is mounted may be formed to be recessed with a circumference formed as a sloped face. A hydrophobic pattern 230 is formed to surround the LED chip 220 on the package main body 210. The hydrophobic pattern is formed to have hydrophobicity to serve as a dam defining the resin unit 240 having hydrophilic qualities. The resin 240 encapsulating the LED chip 220 is formed on a region defined by the hydrophobic pattern 230. A component of the resin unit 240 is not particularly limited so long as a material thereof is light-transmissive.

The lens 250 encapsulates the resin unit 240 and is formed to be defined by the hydrophobic pattern 230.

Like the resin unit 240 as described above, the shape of the lens 250 is defined by the hydrophobicity of the hydrophobic pattern 230. A component constituting the lens 250 is not particularly limited so long as a material thereof is light-transmissive, and an insulating resin having translucency such as a silicon resin composition, a modified silicon resin composition, an epoxy resin composition, a modified epoxy resin composition, an acryl resin composition, and the like, can be applicable. Also, a resin having excellent weatherability such as a hybrid resin, or the like, including one or more of silicon, epoxy, and a fluorocarbon resin, may also be used.

Also, a light distribution pattern may be controlled by adjusting the shape of the surface of the lens 250. In detail, the lens 250 may have a convex lens or a concave lens, an oval shaped lens, or the like, to control light distribution. The lens 250 may be formed to have a droplet shape on the resin unit 240 through a droplet process. When the lens 250 is formed to have a droplet shape, the intensity of illumination can be improved.

Figure 4:
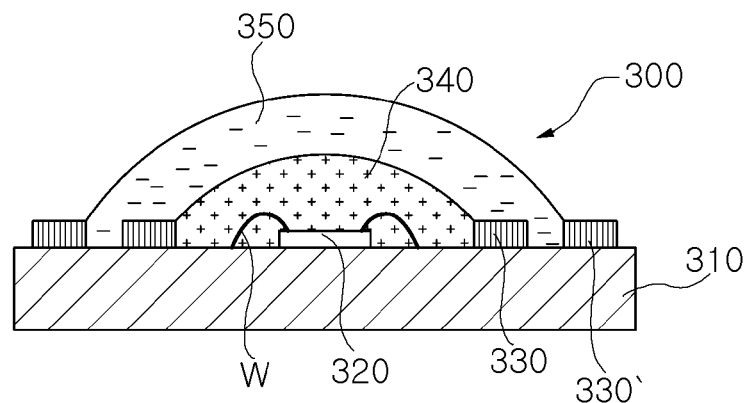
FIG. 4 is a sectional view schematically showing a light emitting diode (LED) package according to a third embodiment of the present disclosure.

An LED package 300 according to a third embodiment of the present disclosure will hereinafter be described. The LED package 300 according to the third embodiment of the present disclosure, the hydrophobic pattern includes two or more spaced apart hydrophobic patterns 330 and 330' formed in a same manner. FIG. 4 is a sectional view schematically showing a light emitting diode (LED) package according to the third embodiment of the present disclosure.

As shown in FIG. 4, the LED package 300 according to the third embodiment of the present disclosure includes a package main body 310, an LED chip 320, hydrophobic patterns 330 and 330', a resin unit 340, and a lens 350.

Similar to the case as described above, the LED chip 320 is mounted on one surface of the package main body 310, and the surface of the package main body 310 on which the LED chip 320 is mounted may be formed to be recessed with a circumference formed as a sloped face.

Two or more hydrophobic patterns 330 and 330' are formed in a same manner to surround the LED chip 320. The hydrophobic patterns 330 and 330' are formed to have hydrophobicity to serve as dams defining the resin unit 340 having hydrophilic qualities. The resin unit 340 encapsulating the LED chip 320 is formed in a region defined by the inner hydrophobic pattern 330, among the two or more hydrophobic patterns, and the lens 350 encapsulating the resin unit 340 is formed in a region defined by the outer hydrophobic pattern 330', among the duplicated hydrophobic patterns. A component of the resin unit 340 and the lens 350 is not particularly limited so long as a material thereof is light-transmissive.

When the hydrophobic patterns 330 and 330' are formed in the same manner, the inner hydrophobic pattern 330 defining the resin unit 340 and the outer hydrophobic pattern 330' defining the lens 350 may be formed to be different to allow the resin unit 340 and the lens 350 to have different shapes.

Figure 5:
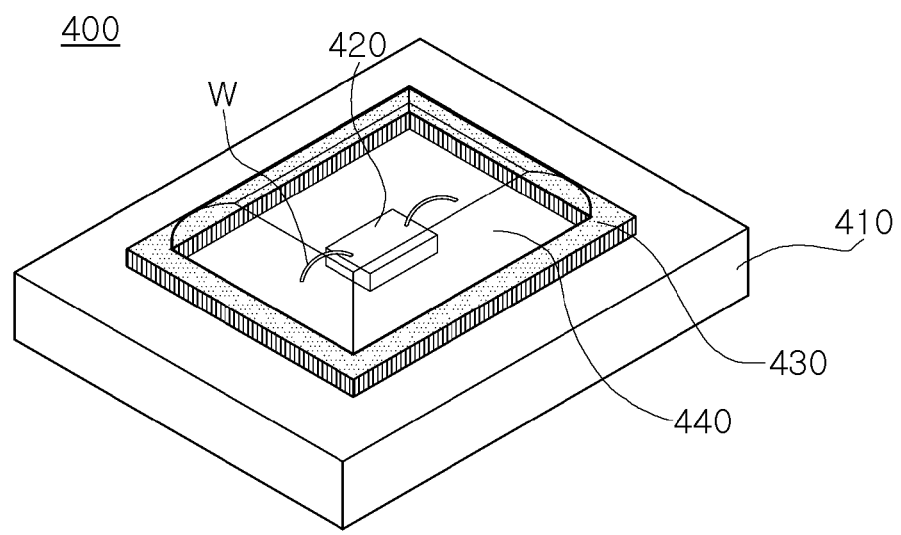
FIG. 5 is a perspective view schematically showing a light emitting diode (LED) package according to a fourth embodiment of the present disclosure.
Figure 6:
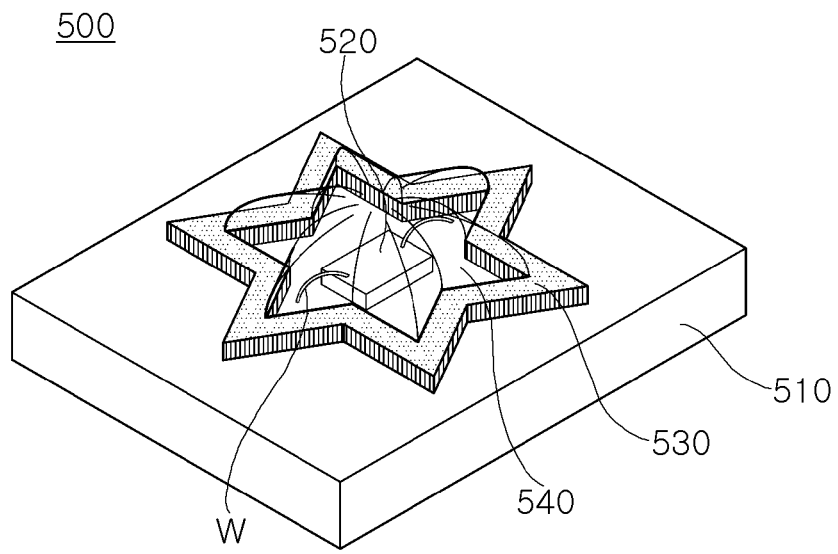
FIG. 6 is a perspective view schematically showing a light emitting diode (LED) package according to a fifth embodiment of the present disclosure.
Figure 7:
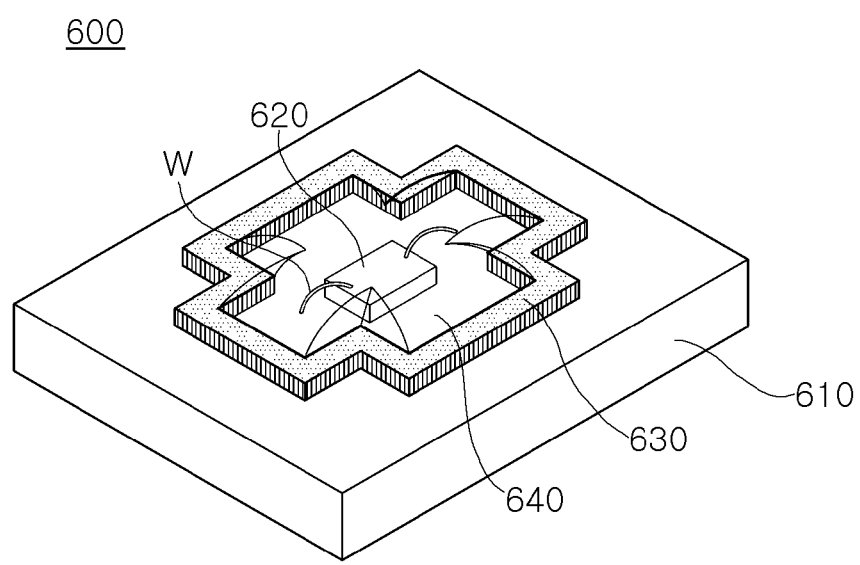
FIG. 7 is a perspective view schematically showing a light emitting diode (LED) package according to a sixth embodiment of the present disclosure.

In a fourth embodiment, as shown in FIG. 5, the resin unit 440 surrounding the LED chip 420 is defined by a hydrophobic pattern 430 having a quadrangular shape on the package main body 410. In a fifth embodiment, as shown in FIG. 6, the resin unit 540 surrounding the LED chip 520 is defined by a hydrophobic pattern 530 having a star-like shape on the package main body 510. In a sixth embodiment, as shown in FIG. 7, the resin unit 640 surrounding the LED chip 620 is defined by a hydrophobic pattern 630 having a cross-like shape on the package main body 610.

An LED package 700 according to a seventh embodiment of the present disclosure will hereinafter be described. In the LED package 700 according to the seventh embodiment of the present disclosure, a surface of a hydrophobic pattern is modified to have hydrophilic qualities to prevent a portion of the resin unit 740 encapsulating the LED chip 720 from being leaked to electrodes 750 and 760 formed on the package main body 710 in a dispensing process.

Figure 8:
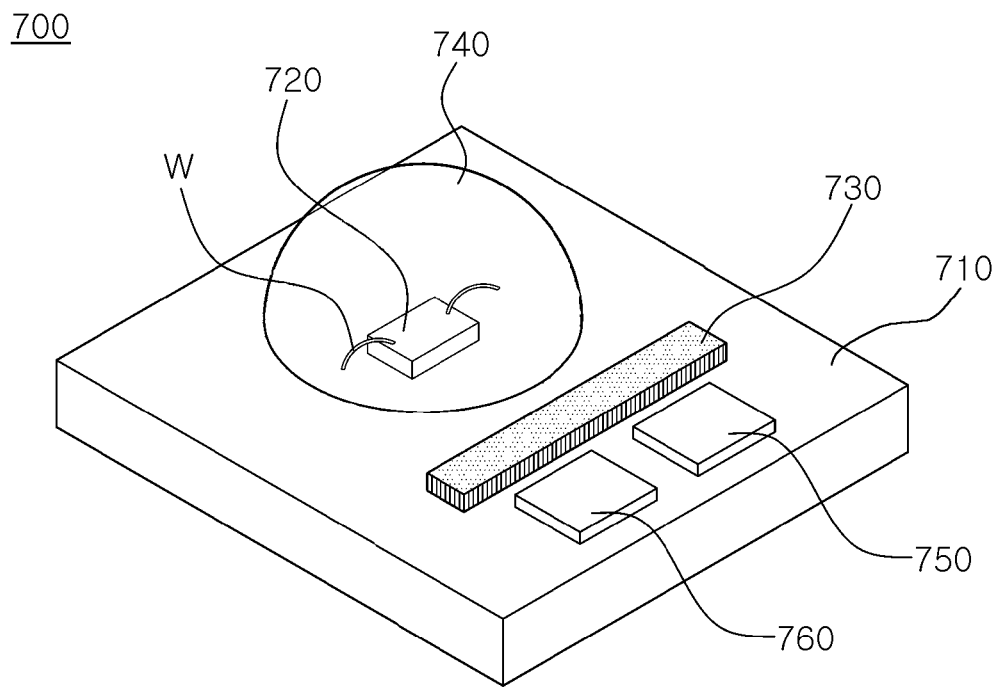
FIG. 8 is a perspective view schematically showing a light emitting diode (LED) package according to a seventh embodiment of the present disclosure.

FIG. 8 is a perspective view schematically showing a light emitting diode (LED) package according to a seventh embodiment of the present disclosure.

As shown in FIG. 8, the light emitting diode (LED) package according to the seventh embodiment of the present disclosure includes a package main body 710, an LED chip 720 mounted on the package main body 710, a hydrophilic pattern 730, and a resin unit 740 formed to be spaced apart from the hydrophilic pattern 730.

Similar to the case described above, the LED chip 720 is mounted on one surface of the package main body 710, and the surface of the package main body 710 on which the LED chip 720 is mounted may be formed to be recessed with a circumference formed as a sloped face. Any LED chip may be used as the LED chip 720 so long as it is a photoelectric element that emits light when an electrical signal is applied thereto. The LED chip 720 is encapsulated by the resin unit 740, a circumferential face of the resin unit 740 may be defined by a dam (not shown).

As mentioned above, the hydrophilic pattern 730 is obtained by modifying the surface of a hydrophobic pattern by performing an oxygen (O2) plasma treatment on the hydrophobic pattern to assume hydrophilicity. The hydrophilic pattern 730 is formed to be interposed between the resin unit 740 and the electrodes 750 and 760. The hydrophilic pattern 730, having hydrophilic qualities, adsorbs the liquid resin unit 740 leaked during a dispensing process to prevent the resin unit 740 from being formed on the electrodes 750 and 760.

If the resin unit 740 is formed on the electrodes 750 and 760, a bonding of wires to the electrodes 750 and 760 is hampered, resulting in a failure of a supply of power to the LED chip 720, causing the LED package 700 to be defective. The hydrophilic pattern 730 is interposed between the resin unit 740 and the electrodes 750 and 760 to effectively prevent a defective LED package that may be generated during the dispensing process.

A method for fabricating the LED package 100 according to the first embodiment of the present disclosure will hereinafter be described.

FIGS. 9 through 13 are views schematically showing a method for fabricating an LED package according to the first embodiment of the present disclosure.

The method for fabricating the LED package 100 includes forming the hydrophobic pattern 130 on the package main body 110; mounting the LED chip 120 on a region surrounded by the hydrophobic pattern 130; and forming the resin unit 140 encapsulating the LED chip 120.

Figure 9:
FIGS. 9 through 13 are views schematically showing a method for fabricating an LED package according to the first embodiment of the present disclosure.
Figure 10:
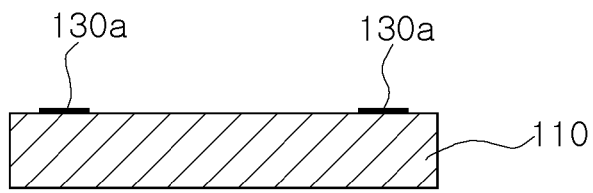

First, as shown in FIG. 9, the package main body 110 is prepared. As shown in FIG. 10, the seed layer pattern 130a is formed on the package main body 110.

The seed layer pattern 130a is formed by depositing a thin film layer made of gold (Au), copper (Cu), or an alloy thereof on a surface of the package main body 110 on which the LED chip 120 is to be mounted.

The seed layer pattern 130a may be formed as a single layer, or may be formed to be multi-layered by depositing a plurality of thin film layers made of gold (Au), copper (Cu), or an alloy thereof. The seed layer pattern 130a may be made of ZnO.

Figure 11:
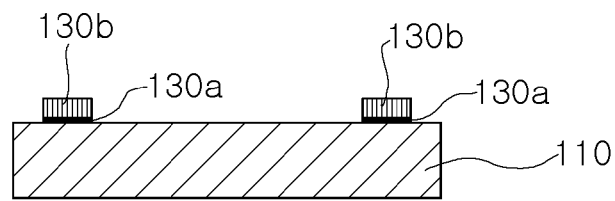

Thereafter, as shown in FIG. 11, the package main body 110 with the seed layer pattern 130a formed thereon is immersed in a ZnO solution to form the nano-structures 130b on the seed layer pattern 130a. The ZnO solution may be a solution obtained by dissolving a ZnO film in a solution in which 0.01M of $(Zn(NO_3)_2 \cdot 6H_2O)$ and 0.25M of HMT $(C_6H_{12}N_4)$ are mixed in a ratio of 1:1.

Figure 12:
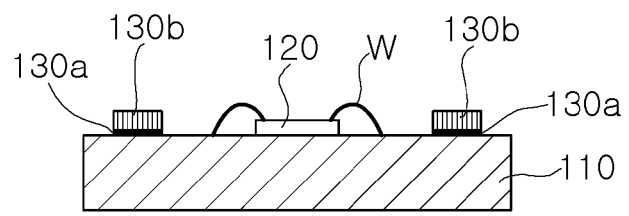

Then, as shown in FIG. 12, the LED chip 120 is mounted on a region surrounded by the hydrophobic pattern 130 formed as described above.

The mounting of the LED chip 120 may be performed through a process of bonding the electrodes (not shown) formed on the upper surface of the LED chip 120 and a lead frame (not shown) on the package main body 110 by wires (W).

Figure 13:
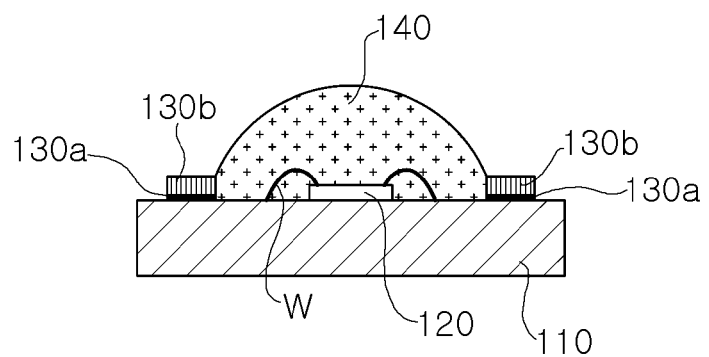

Subsequently, as shown in FIG. 13, the resin unit 140, encapsulating the LED chip 120, is formed on a region whose circumference is defined by the hydrophobic pattern 130, thus fabricating the LED package 100.

A method for fabricating the LED package 700 according to the seventh embodiment of the present disclosure will hereinafter be described.

The method for fabricating the LED package 700 includes forming a hydrophobic pattern on the package main body 710; modifying the surface of the package main body 710 with the hydrophobic pattern formed thereon into a surface having hydrophilicity; mounting the LED chip 720; and forming the resin unit 740.

First, as described above in the first embodiment of the present disclosure, the package main body 710 is prepared, and a hydrophobic pattern is formed on the package main body 710.

Next, the surface of the hydrophobic pattern is subjected to an oxygen ($O_2$) plasma treatment to form the hydrophilic pattern 730. As described above, the hydrophobic pattern may include a plurality of nano-structures, so the hydrophilic pattern 730 obtained from the hydrophobic pattern can have strong hydrophilic absorptive power due to a large contact area. Thus, since the hydrophilic pattern 730 has strong hydrophilic adsorptive power, it can effectively adsorb a hydrophilic material.

Then, the LED chip 720 is mounted on the package main body 710, and the resin unit 740 is formed to encapsulate the LED chip 720.

The hydrophilic pattern 730 adsorbs the liquid resin unit leaked in the process of dispensing the liquid resin unit to the LED chip 720, preventing the resin unit 740 from being formed on the electrodes 750 and 760.

As set forth above, according to embodiments of the disclosure, the LED package which incurs less production costs and has various patterns and enhanced intensity of illumination can be provided.

Also, the method for fabricating an OLED package which incurs less production costs and has various patterns and enhanced intensity of illumination can be provided.

While the present invention has been shown and described in connection with the embodiments, it will be apparent to those skilled in the art that modifications and variations can be made without departing from the spirit and scope of the invention as defined by the appended claims.

What is claimed is:

1. A light emitting diode (LED) package comprising:
a package main body;
an LED chip mounted on the package main body; and
a hydrophobic pattern formed on the package main body spaced apart from the LED chip, wherein the hydrophobic pattern comprises a plurality of nano-structures and a seed layer pattern formed on the package main body,
wherein the plurality of nano-structures are grown from the seed layer pattern, and
the seed layer has a multilayered structure in which gold (Au) and copper (Cu) are alternately stacked; and
a resin encapsulating the LED chip, wherein the resin is defined by the hydrophobic pattern.

2. The LED package of claim 1, wherein the resin comprises a phosphor.

3. The LED package of claim 1, wherein the resin has a contact angle of 90° or greater with regard to the package main body.

4. The LED package of claim 1, wherein the hydrophobic pattern includes a circular shape, a triangular shape, a quadrangular shape, and any combination thereof.

5. The LED package of claim 1, wherein the hydrophobic pattern comprises at least two spaced apart patterns formed in a same manner.

6. The LED package of claim 1, further comprising a lens encapsulating the resin, wherein the lens is defined by the hydrophobic pattern.

7. The LED package of claim 5, wherein the lens has a contact angle of 90° or greater with regard to the package main body.

8. The LED package of claim 1, wherein the hydrophobic pattern is subjected to an $O_2$ plasma or an $H_2$ plasma treatment, or is fluorocarbonated.

9. The LED package of claim 1, wherein the nano-structures are made of a zinc oxide (ZnO)-based compound.

10. A light emitting diode (LED) package comprising:
a package main body;
an LED chip mounted on the package main body; and
a hydrophilic pattern formed on the package main body spaced apart from the LED chip, wherein the hydrophilic pattern comprises a plurality of nano-structures and a seed layer pattern formed on the package main body,
wherein the seed layer has a multilayered structure in which gold (Au) and copper (Cu) are alternately stacked; and
a resin encapsulating the LED chip, wherein the resin is defined by the hydrophilic pattern.

11. The LED package of claim 10, wherein the hydrophilic pattern is subjected to an $O_2$ plasma treatment.

* * * * *